(12) United States Patent
Chen et al.

(10) Patent No.: US 8,270,239 B2
(45) Date of Patent: Sep. 18, 2012

(54) SEMICONDUCTOR MEMORY DEVICE AND METHODS OF PERFORMING A STRESS TEST ON THE SEMICONDUCTOR MEMORY DEVICE

(75) Inventors: Nan Chen, San Diego, CA (US); Changho Jung, San Diego, CA (US); Zhiqin Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 739 days.

(21) Appl. No.: 12/330,747

(22) Filed: Dec. 9, 2008

(65) Prior Publication Data

US 2010/0142300 A1 Jun. 10, 2010

(51) Int. Cl.
*G11C 29/50* (2006.01)
*G11C 29/06* (2006.01)
*G11C 29/00* (2006.01)
*G11C 11/41* (2006.01)
*G11C 11/413* (2006.01)
*G11C 8/08* (2006.01)
*G11C 7/12* (2006.01)

(52) U.S. Cl. ........ 365/201; 365/154; 365/156; 365/203; 365/204; 365/233.1

(58) Field of Classification Search .......... 365/154, 365/156, 201, 203, 204, 233.1
See application file for complete search history.

(56) References Cited

U.S. PATENT DOCUMENTS

| | | | | | |
|---|---|---|---|---|---|
| 5,629,943 | A | * | 5/1997 | McClure | 714/718 |
| 5,835,427 | A | * | 11/1998 | McClure | 365/201 |
| 5,949,731 | A | * | 9/1999 | Tsukude | 365/230.01 |
| 6,256,241 | B1 | * | 7/2001 | Mehalel | 365/201 |
| 6,449,200 | B1 | * | 9/2002 | Nelson et al. | 365/201 |

OTHER PUBLICATIONS

International Search Report and Written Opinion—PCT/US2009/066991—ISA/EPO—Feb. 25, 2010.

* cited by examiner

*Primary Examiner* — J. H. Hur
(74) *Attorney, Agent, or Firm* — Sam Talpalatsky; Nicholas J. Pauley; Jonathan T. Velasco

(57) ABSTRACT

A semiconductor memory device and method of performing a stress test on a semiconductor memory device are provided. In an example, the semiconductor memory device includes a multiplexer arrangement configured to switch a timing signal that controls an internal timing of the semiconductor memory device from an internal signal to an external signal during a stress mode, and further includes one or more word lines of the semiconductor memory device receiving a stress voltage during the stress mode, a duration of the stress mode based upon the external signal. In another example, the semiconductor memory device includes one or more word lines configured to receive a stress voltage during a stress mode, and a precharge circuit configured to provide a precharge voltage to a bit line of the semiconductor memory device during the stress mode.

24 Claims, 9 Drawing Sheets

SEMICONDUCTOR MEMORY DEVICE AND METHODS OF PERFORMING A STRESS TEST ON THE SEMICONDUCTOR MEMORY DEVICE

FIELD OF DISCLOSURE

The invention relates to a semiconductor memory device and methods of performing a stress test on the semiconductor memory device.

BACKGROUND

During the fabrication of semiconductor memory devices, each semiconductor memory device is typically tested to ensure reliability and proper functionality. Latent defects in a given semiconductor memory device may not be detected under "normal" operation conditions. Normal operating conditions may include write, read and/or erase operations executed with voltages set within a normal operating range.

In order to screen a higher number of semiconductor memory devices, the memory test may further include a "stress test". A conventional stress test typically includes testing a given semiconductor memory device under more extreme conditions than the "normal" conditions. For example, a stress test can include a higher voltage applied to specific elements (e.g., word lines) of the semiconductor memory device, a higher or colder ambient or operating temperature, etc. As will be appreciated by one of ordinary skill in the art, stress testing further reduces the number of semiconductor memory devices that pass the testing phase, and potentially enter the market, which may improve product reliability.

Typically, latent defects within semiconductor memory devices, such as static random access memory (SRAM), are more likely to occur within memory bit cells of the semiconductor memory device. For example, one or more memory bit cells may fail due to deterioration of a gate oxidation film, a defective leakage current of an impurity diffusion region or weak via/contacts in a bit cell pull-down path, etc.

FIG. 1 illustrates a bit cell 105 and a pre-charge circuit 110 of a conventional semiconductor circuit 100. Referring to FIG. 1, the bit cell 105 includes transistors pd1, pd2, pu1, pu2, pg1, and pg2. The functionality of the bit cell 105 is well-known in the art, and will not be described further for the sake of brevity. For example, for a further description of a bit cell similar to the bit cell 105 of FIG. 1, see U.S. Pat. No. 5,424,988, entitled "Stress test for memory arrays in integrated circuits", filed on Sep. 30, 1992 by McClure et al., and hereby incorporated by reference in its entirety.

The pre-charge circuit 110 includes three transistors, and is configured to apply a bit-line precharge voltage to each of bit lines BIT and BITB. The pre-charge circuit 110 is typically activated prior to an access of the bit cell 105 (e.g., a read access, a write access, an erase operation, etc.) during normal operation of the semiconductor circuit 100.

Conventionally, upon initiation of a stress test, one or more word lines are selected and remain activated for the duration of the stress test. Also during the stress test, one bit line BIT in the memory array is set to a higher voltage, or stress voltage. The stress voltage is then applied through the bit line BIT to gates and reverse biased pn junctions between the diffusion and substrate for the selected word lines for the duration of the test. Therefore, referring to FIG. 1, gate pg1, pg2, pd2, pu2, and junction n1 are stressed. However, the pre-charge circuit 110 is not typically activated during a stress test, and the applied stress voltage does not affect, for example, vias connected to the bit line pull down path. Thus, the bit line BITB is set to a floating voltage or low voltage level during the stress test. After a given amount of time, the stress voltage "switches" from the bit line BIT to the bit line BITB. After the switch, the bit line BIT carries a low voltage, and the bit line BITB carries the stress voltage. Thus, the bit lines BIT and BITB do not typically carry the stress voltage at the same time during the stress test.

Accordingly, only the transistor and junctions are tested, such that conventional stress test does not necessarily test or stress vias connected to the bit line (e.g., which may be relatively weak and defect-prone), and defects present therein may not be detected during the testing phase of the semiconductor circuit 100.

SUMMARY

An embodiment of the invention is directed to a method of performing a stress test on a semiconductor memory device, including transitioning the semiconductor memory device from normal mode to a stress mode, switching a timing signal that controls an internal timing of the semiconductor memory device from an internal signal to an external signal and applying a stress voltage to one or more word lines of the semiconductor memory device during the stress mode, a duration of the stress mode based upon the external signal.

Another embodiment of the invention is directed to a method of performing a stress test on a semiconductor memory device, including transitioning the semiconductor memory device from normal mode to a stress mode, applying a stress voltage to one or more word lines of the semiconductor memory device during the stress mode and enabling, during the stress mode, a precharge circuit to provide a precharge voltage to a bit line of the semiconductor memory device.

Another embodiment of the invention is directed to a semiconductor memory device, including a multiplexer arrangement configured to switch a timing signal that controls an internal timing of the semiconductor memory device from an internal signal to an external signal during a stress mode and one or more word lines of the semiconductor memory device receiving a stress voltage during the stress mode, a duration of the stress mode based upon the external signal.

Another embodiment of the invention is directed to a semiconductor memory device, including one or more word lines of the semiconductor memory device configured to receive a stress voltage during a stress mode and a precharge circuit configured to provide a precharge voltage to a bit line of the semiconductor memory device during the stress mode.

Another embodiment can include an apparatus for performing a stress test on a semiconductor memory device, comprising: means for transitioning the semiconductor memory device from normal mode to a stress mode; means for switching a timing signal that controls an internal timing of the semiconductor memory device from an internal signal to an external signal; and means for applying a stress voltage to one or more word lines of the semiconductor memory device during the stress mode, wherein a duration of the stress mode is based upon the external signal.

Another embodiment can include an apparatus for performing a stress test on a semiconductor memory device, comprising: means for transitioning the semiconductor memory device from normal mode to a stress mode; means for applying a stress voltage to one or more word lines of the semiconductor memory device during the stress mode; and means for enabling, during the stress mode, a precharge circuit to provide a precharge voltage to a bit line of the semiconductor memory device.

BRIEF DESCRIPTION OF THE DRAWINGS

A more complete appreciation of embodiments of the invention and many of the attendant advantages thereof will be readily obtained as the same becomes better understood by reference to the following detailed description when considered in connection with the accompanying drawings which are presented solely for illustration and not limitation of the invention, and in which.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

In order to better understand the present invention, a conventional manner of controlling the pre-charge circuit 110 of FIG. 1 will be described with respect to FIGS. 2 and 3, followed by a description of embodiments of the present invention.

Figure 1:
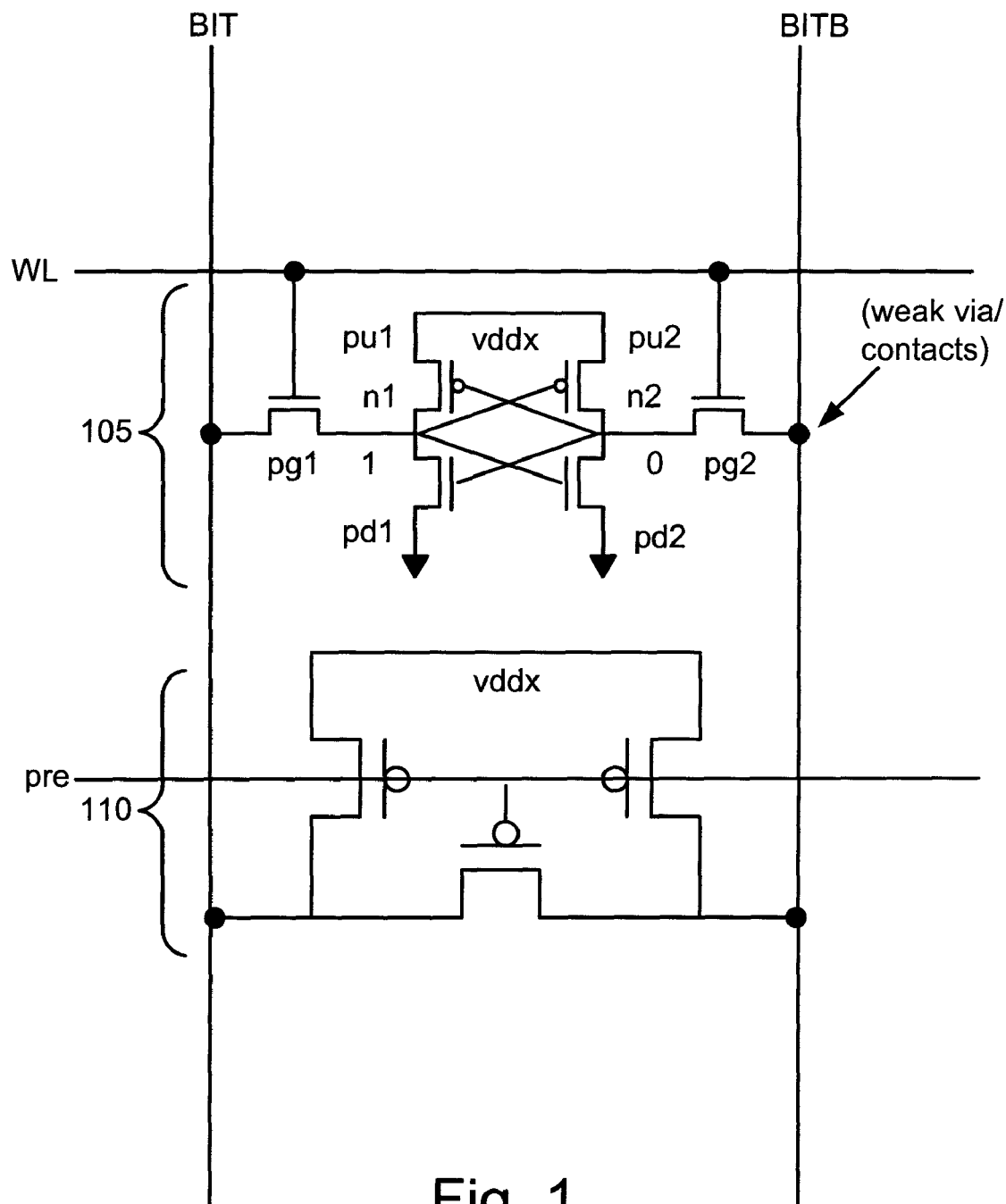
FIG. 1 illustrates a bit cell and a pre-charge circuit of a conventional semiconductor circuit.
Figure 2:
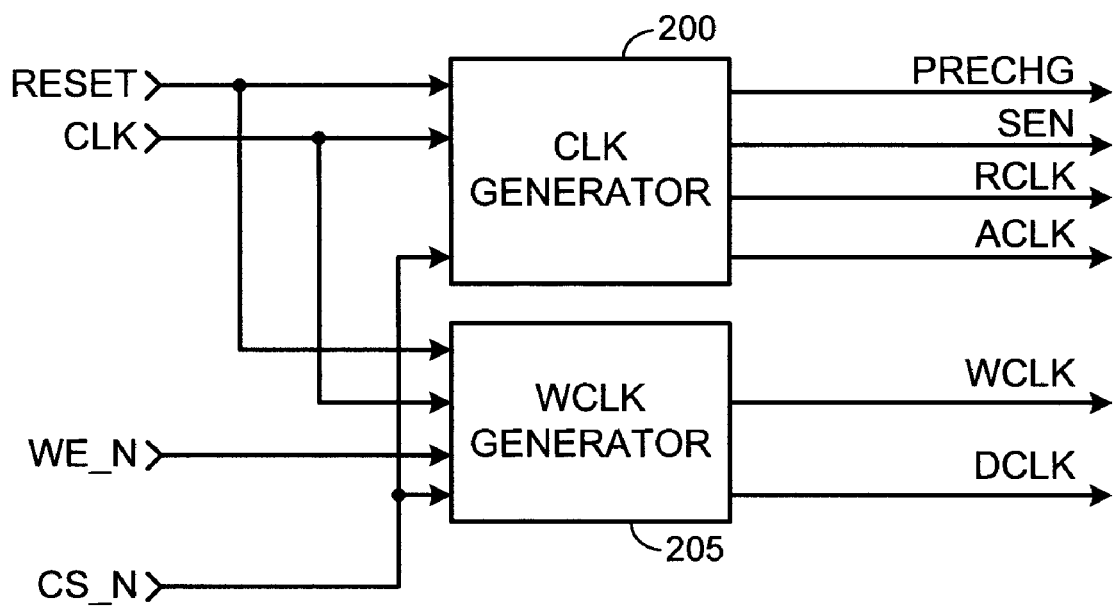
FIG. 2 illustrates first and second clock generators of a conventional semiconductor circuit.

FIG. 2 illustrates first and second clock generators 200 and 205 of a conventional semiconductor circuit. The first and second clock generators 200 and 205 provide clock or timing signals (PRECHG, SEN, RCLK, ACLK, WCLK, DCLK) based on input signals (RESET, CLK, WE_N, CS_N) to a semiconductor memory device 300 as illustrated in FIG. 3. The semiconductor memory device 300 includes a latch circuit 305, a column and row decoder 310, a memory array 315, a bit line pre-charge circuit 320 (e.g., the pre-charge circuit 110 in FIG. 1), a sense amplifier circuit 325, a data input buffer circuit 330 and a data latch circuit 335. The respective clock signals are routed to elements of the semiconductor memory device 300. In particular, ACLK is routed to the latch circuit 305, RLK is routed to the column and row decoder 310, PRECHG is routed to the bit line pre-charge circuit 320, SEN is routed to the sense amplifier circuit 325, WCLK is routed to the data input buffer circuit 330 and DCLK is routed to the data latch circuit 335. The functionality of each circuit within the semiconductor memory device 300 based on their associated clock signals is well-known in the art, and will not be described further for the sake of brevity.

The timing signal PRECHG corresponds to the input signal PRE of the pre-charge circuit 110 of FIG. 1, and controls whether the pre-charge circuit 110, which may be included within the bit line pre-charge circuit 320, is "turned on" or "turned off". Conventionally, the timing signal PRECHG is based on the external clock signal CLK, and will transition to a lower level during the stress test, thereby turning off the pre-charge circuit 110 such that vias or contact points (shown in FIG. 1), which may be prone to defects, are not tested or stressed during the stress test.

Figure 3:
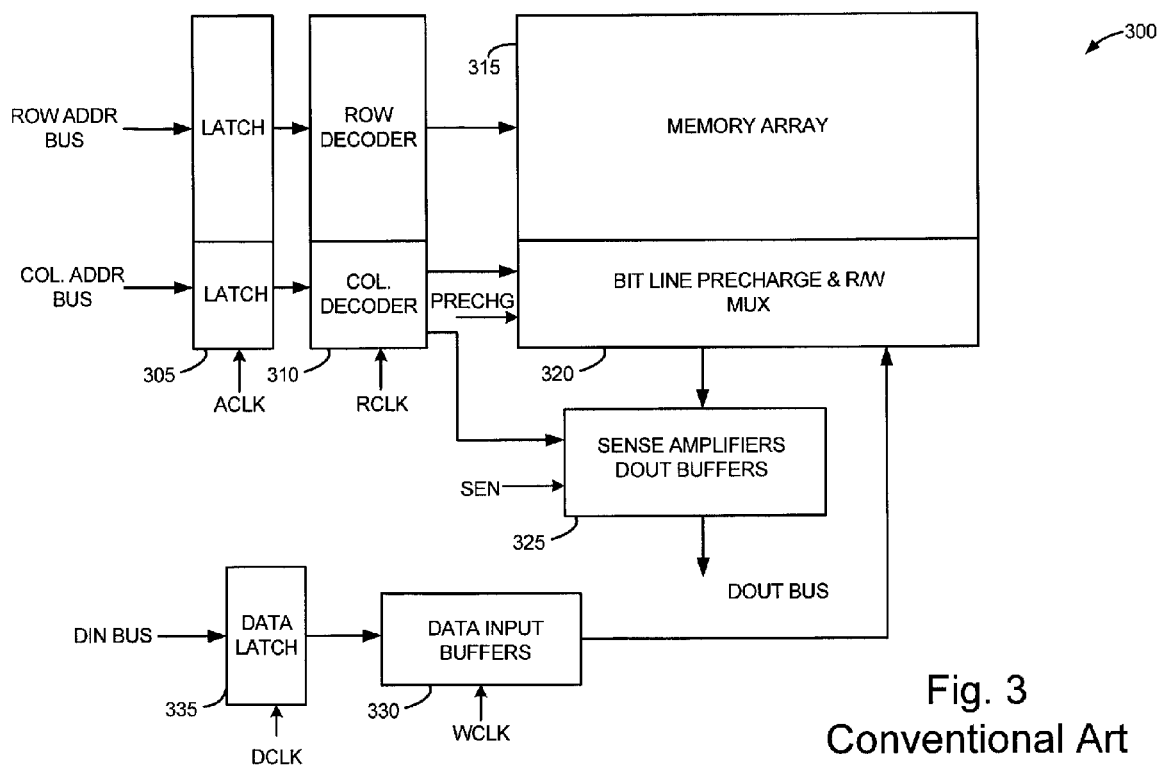
FIG. 3 illustrates a conventional semiconductor memory device.
Figure 4:
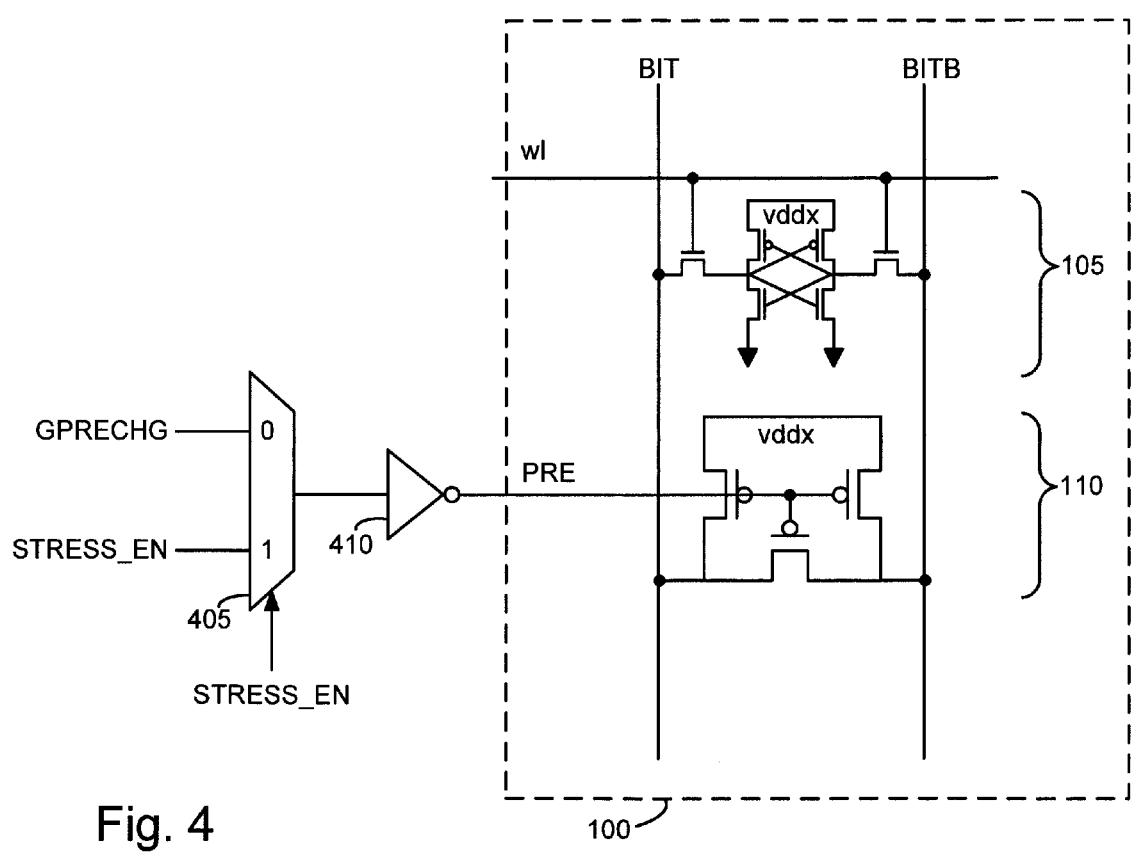
FIG. 4 illustrates a semiconductor circuit.

FIG. 4 illustrates a semiconductor circuit 400 according to an embodiment of the present invention. As shown in FIG. 4, the semiconductor circuit 400 includes the semiconductor circuit 100 of FIG. 1 and further includes a multiplexer 405 and an inverter 410. The multiplexer 405 receives a "normal" or "functional" global precharge signal GPRECHG, and a stress enable signal STRESS_EN. The global precharge signal GPRECHG generally corresponds to the precharge signal PRE or PRECHG as illustrated in FIGS. 1, 2 and 3, respectively. In other words, the precharge signal GPRECHG corresponds to normal operation, or operation of the semiconductor circuit 100 wherein a stress test is not activated.

The stress enable signal STRESS_EN is a signal that is set to a first logic level (e.g., a higher logic level or "1") during a stress test, and is set to a second logic level (e.g., a lower logic level or logic "0") during normal operation or non-stress test. As shown in FIG. 4, the multiplexer 405 is configured such that the stress enable signal STRESS_EN functions as both a selection signal and an input signal. Thus, if the stress enable signal STRESS_EN is set to the first logic level, such that the stress enable "input" signal STRESS_EN is selected, the first logic level passes through the multiplexer 405 and is inverted by the inverter 410, which outputs a precharge circuit input signal PRE at the second logic level (e.g., a lower logic level or logic "0") to the precharge circuit 110. As will be appreciated, the pre-charge circuit is activated when PRE is set to the second logic level.

Figure 5:
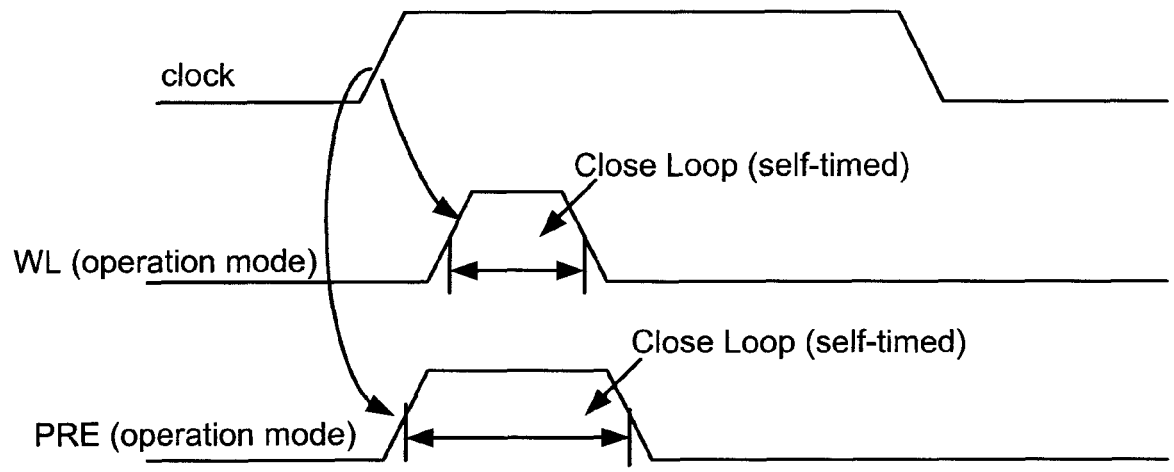
FIGS. 5 and 6 illustrate an operation of the semiconductor circuit.
Figure 6:
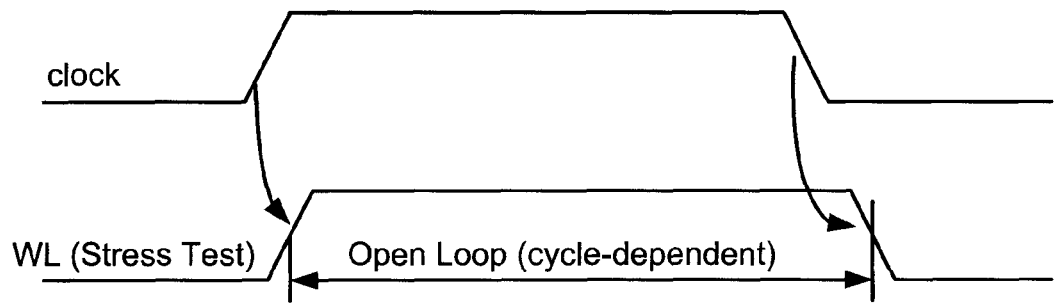

FIGS. 5 and 6 illustrate an operation of the semiconductor circuit 400 according to embodiments of the present invention. Referring to FIG. 5, the semiconductor circuit 400 is in normal operation mode, and the external clock signal CLK rises from a lower logic level to a higher logic level. Because the semiconductor circuit 400 is not undergoing a stress test, the stress enable signal STRESS_EN is set to 0, and an inverted version of the global precharge signal GPRECHG is output from the inverter 410 as the precharge circuit input signal PRE.

As shown in FIG. 5, during normal operation, internal timing is controlled by a self time tracking scheme, as is known in the art. Here, memory access is dependent upon an active, or rising, edge of an external clock active edge. When a memory access is activated, internal timing (e.g., when to enable/disable PRE, when to enable the sense amplifier, etc.) is self tracked. In a self time tracking scheme, a dummy word line and bit column is used to track the real bit line timing and generate the RESET signal to perform memory access, as is known in the art. The self timed loop can be programmed to obtain adequate read/write margins for performance and high yield for various memory configurations and across process, temperature and/or voltage (PVT) variations.

Referring to FIG. 6, during a stress test, the self timed scheme is not used because the word line is kept on for a longer period of time (e.g., for the duration of the stress test). Rather, the access time window for a memory operation is controlled by an external signal and can be extended for any length of time. Also, as shown in FIG. 6, the precharge circuit input signal PRE is maintained at the second logic level (e.g., a lower logic level or "0") throughout the stress test based on the stress enable signal STRESS_EN, as discussed above. In an example, by keeping the precharge circuit on during stress test, current flows continuously through the bit line pull down path, such that vias or contacts in this pull down path are stressed.

A description of signal operations during a stress test according to embodiments of the present invention will now be described with respect to FIGS. 7 through 9.

Figure 7:
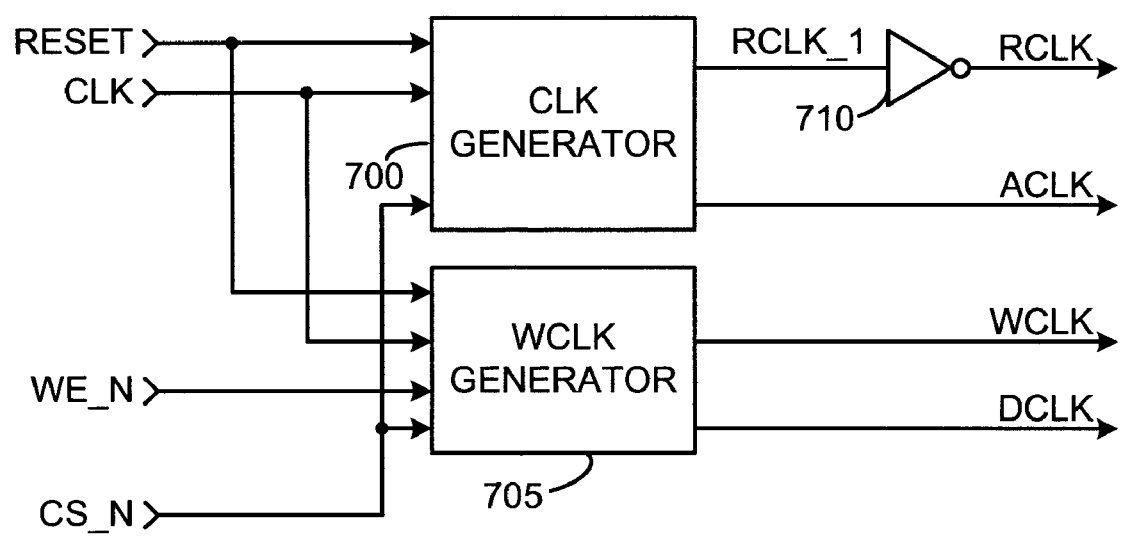
FIG. 7 illustrates first and second clock generators and an inverter.

FIG. 7 illustrates first and second clock generators 700 and 705 and an inverter 710 according to an embodiment of the present invention. The first and second clock generators 700 and 705 provide clock signals (RCLK_1, ACLK, WCLK, DCLK) based on input signals (RESET, CLK, WE_N, CS_N). The inverter 710 inverts RCLK_1 to generate RCLK. Generally, the signals generated in FIG. 7 can be routed to the respective circuit elements of FIG. 3 as described above.

Figure 8:
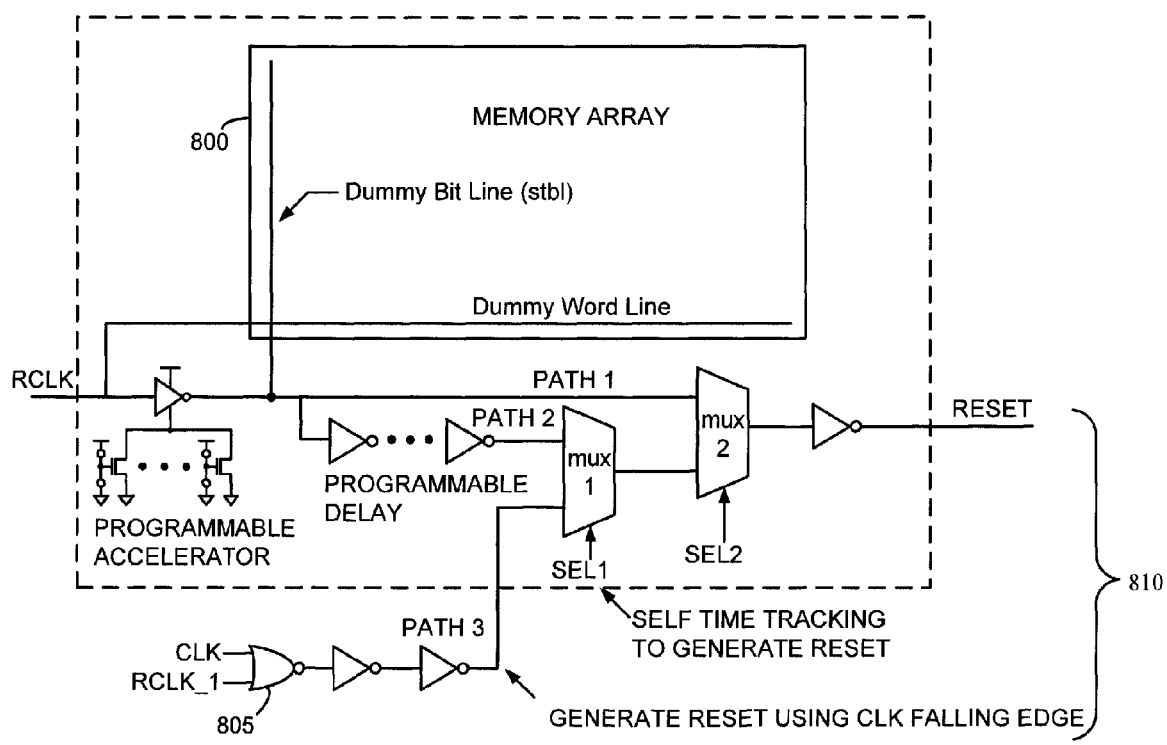
FIG. 8 illustrates a memory array and memory timing control circuit.

Referring to FIG. 8, a memory array 800 may be included within a semiconductor memory device that may further include elements such as a latch circuit, a column and row decoder, a bit line pre-charge circuit, a sense amplifier circuit, a data input buffer circuit and a data latch circuit, etc., as illustrated in FIG. 3. For the sake of simplicity, only the memory array 800 is illustrated in FIG. 8. FIG. 8 further includes a memory timing control circuit 810. FIG. 8 is described in greater detail below with respect to FIG. 9.

Figure 9:
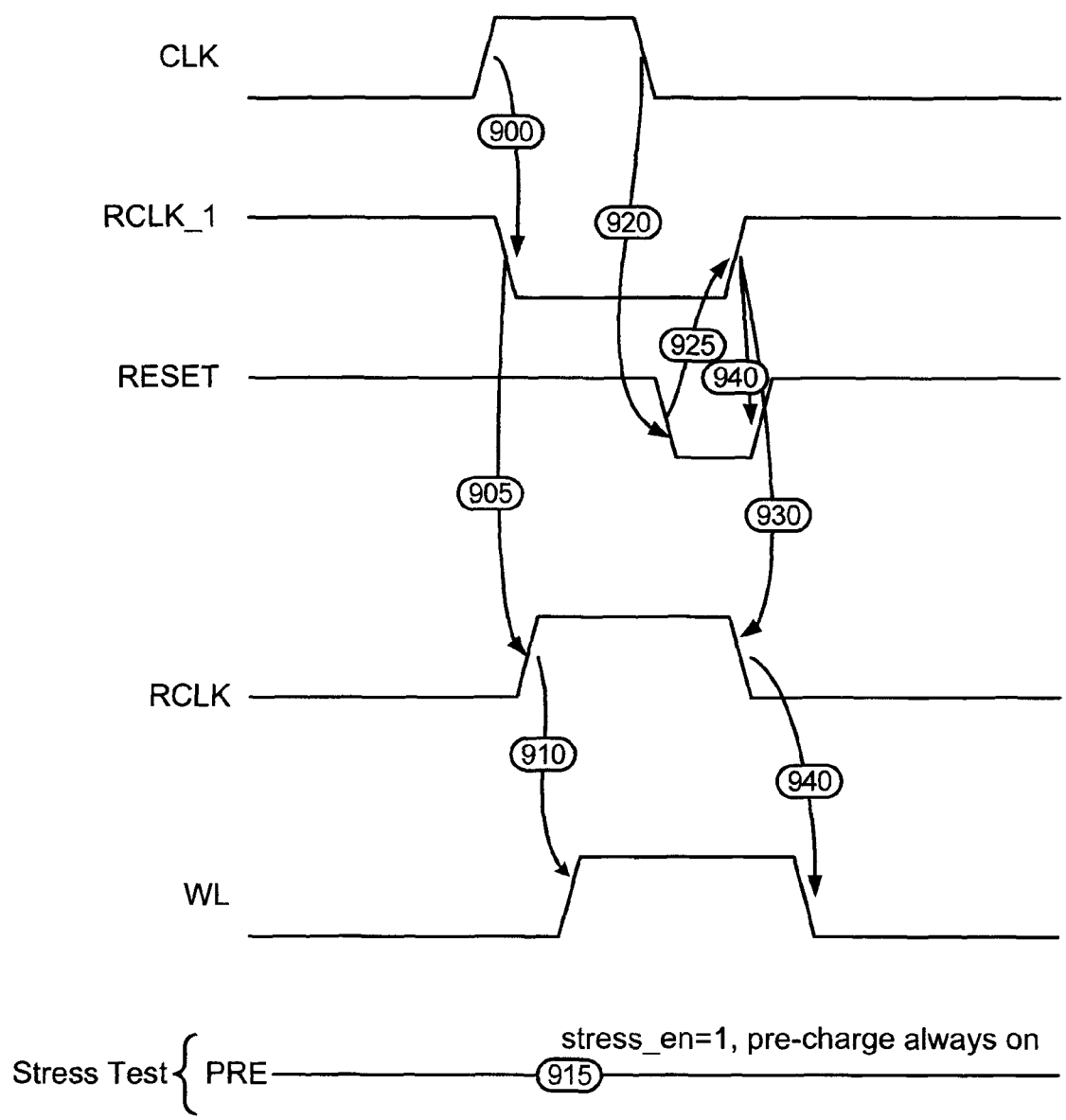
FIG. 9 illustrates timing of signals during a stress test.

FIG. 9 illustrates timing of signals during a stress test according to an embodiment of the present invention.

Referring to FIGS. 7, 8 and 9, during a stress test, assume that the memory array 800 is a rising edge triggered memory. With this assumption, during the stress test, the MUX selection signals from FIG. 8 can be programmed so that path 1 and 2 (self timed paths) are deselected, and path 3 is selected to generate a RESET signal.

Again, referring to FIGS. 7, 8 and 9, during a stress test, assume a read access is applied. The clock generator pulls RCLK_1 down to a lower logic level at a rising edge of the external clock signal CLK if CS_N is low, 900. RCLK and ACLK (not shown) will then transition to a higher logic level, 905. Here, RCLK is used to clock the row address decoder, and ACLK is the address latch clock. Next, a given word line WL is enabled or activated, 910 with stress voltage. By using NOR gate 805, the RESET signal is maintained at the higher logic level as long as the clock signal CLK is maintained at the higher logic level, 915. At a falling edge of the external clock signal CLK, RCLK_1 remains at the lower logic level, and RESET transitions to the lower logic level, 920. Thus, the clock generator 700 will transition RCLK_1 to the higher logic level, 925, and both RCLK and ACLK are transitioned or reset to the lower logic level, 930. The falling edge of RCLK is used to enable the sense amplifier, 935 and disable the word line, 940. Through the NOR gate 805, RESET transitions to the higher logic level again after RCLK_1 transitions to the higher logic level, 940. The access cycle then completes. As will be appreciated, because the internal clock reset relies on a falling edge of the clock signal CLK, the read window is cycle dependent and can be extended to any desired length for the stress test.

Accordingly, a stress test of any duration may be achieved in accordance with embodiments of the present invention. Further, for the duration of the stress test, or any portion thereof, a precharge circuit may remain in an "on" state to further stress a memory, which may increase the quality of memory which passes the stress test.

Figure 10:
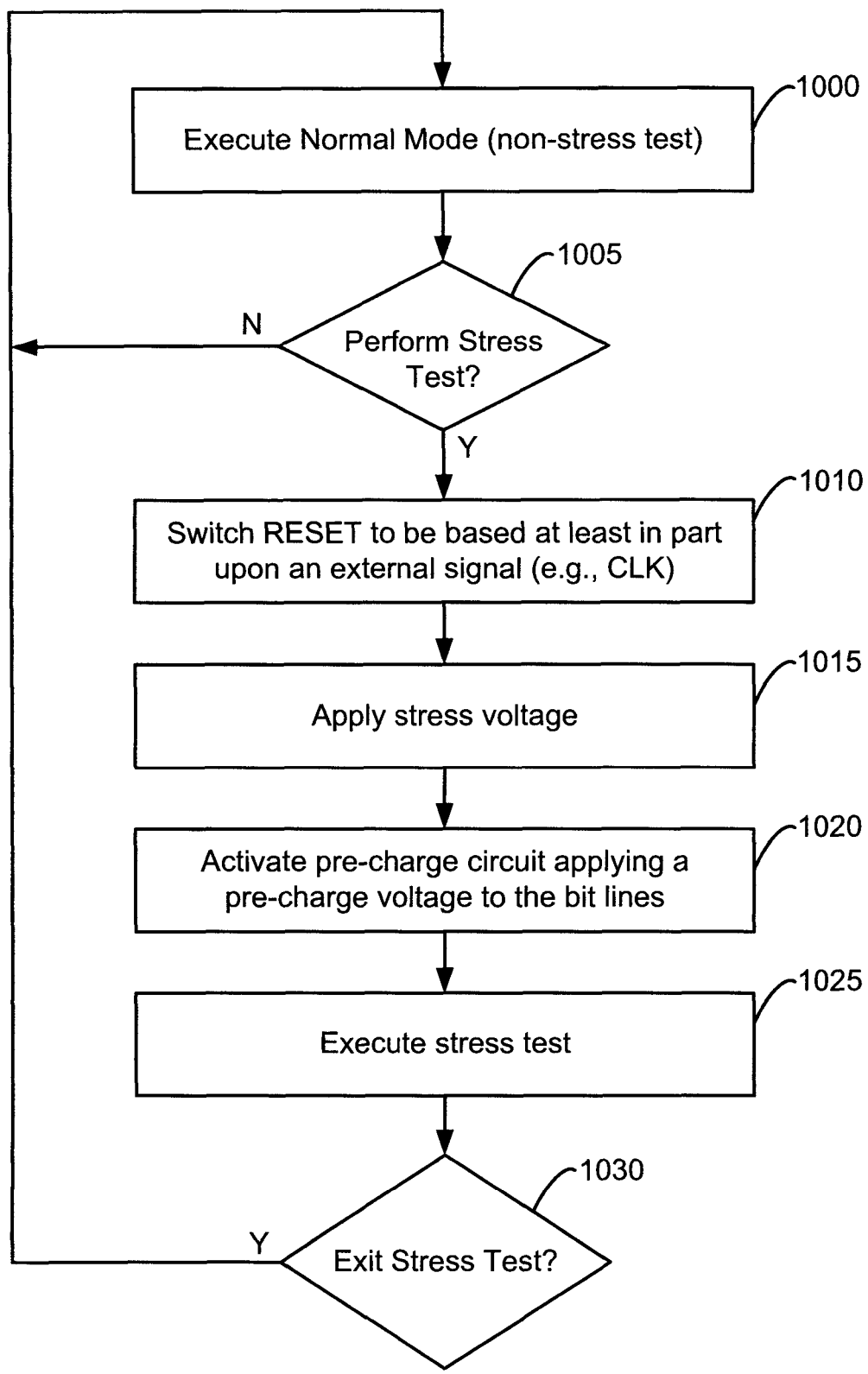
FIG. 10 illustrates a stress test process performed on the semiconductor circuit.

FIG. 10 illustrates a stress test process performed in accordance with an embodiment of the present invention. In particular, FIG. 10 illustrates a more generalized version of the process described with respect to FIGS. 7, 8 and 9 above. While FIGS. 7, 8 and 9 have been described with respect to the particular structure illustrated in FIGS. 4, 7 and 8, FIG. 10 may be implemented in any type of stress test circuitry.

Referring to FIG. 10, assume a given electronic circuit is engaged in normal operation (i.e., the given stress test circuit is not engaged a stress test). For example, in normal mode, the given electronic circuit may perform memory operations (e.g., read operations, write operations, etc.) with a normal voltage, and not a stress voltage. In 1005, the given electronic circuit determines whether to perform a stress test (e.g., based on an external signal). If the given electronic circuit determines not to perform a stress test in 1005, the process returns to 1000. Otherwise, if the given electronic circuit determines to perform a stress test in 1005, a RESET signal is switched from being internally regulated, or self-tracked, to being based upon an external signal, 1010. In an example, this corresponds to MUX1 and MUX2 selecting PATH3 in FIG. 8, such that a falling edge of the external clock signal CLK controls how long the memory array 800 is engaged in stress mode.

Accordingly, in 1015, a stress voltage is applied to one or more bit cells (e.g., of the memory array 800). Also, in 1020, a pre-charge circuit may be maintained in an active state (e.g., by transitioning a stress_en signal to a high level, which causes PRE to go low, thereby activating the pre-charge circuit, as in FIG. 4), such that a pre-charge voltage may also be applied to the one or more stressed bit cells. The stress test is then executed upon the memory array 800, 1025.

In 1030, the given electronic circuit determines whether to continue the stress test. For example, if the external signal has not fallen (e.g., CLK), then the given electronic circuit may determine to continue the stress test. If the given electronic circuit determines to continue the stress test, the stress voltage continues to be applied the one or more bit cells. Otherwise, if the given electronic circuit determines not to continue the stress test (e.g., because CLK has gone low), the process returns to 1000 and the given electronic circuit resumes operation.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of embodiments the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., access terminal). In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of performing a stress test on a semiconductor memory device, comprising:
   transitioning the semiconductor memory device from normal mode to a stress mode;
   switching a timing signal that controls an internal timing of the semiconductor memory device from an internal signal to an external signal; and
   applying a stress voltage greater than a non-stress voltage to one or more word lines of the semiconductor memory device during the stress mode, wherein a duration of the stress mode is based upon a period that a logic level of the external signal indicates the semiconductor memory device to operate in the stress mode.

2. The method of claim 1, further comprising:
   transitioning the semiconductor memory device from the stress mode back to a normal mode; and
   switching the timing signal from the external signal to the internal signal; and
   applying the non-stress voltage to one or more word lines of the semiconductor memory device during the normal mode.

3. The method of claim 1, wherein the timing signal is a clock signal.

4. The method of claim 1, further comprising:
   enabling, during the stress mode, a precharge circuit to provide a precharge voltage to a bit line of the semiconductor memory device.

5. The method of claim 1, wherein the stress voltage is applied to a single word line of the semiconductor memory device during at least a portion of the stress mode.

6. A method of performing a stress test on a semiconductor memory device, comprising:
  transitioning the semiconductor memory device from normal mode to a stress mode;
  applying a stress voltage to one or more word lines of the semiconductor memory device during the stress mode;
  enabling, during the stress mode, a precharge circuit to provide a precharge voltage to a bit line of the semiconductor memory device;
  configuring a multiplexor to receive a stress enable signal and a non-stress precharge control signal as inputs and the stress enable signal as a select signal; and
  configuring an inverter receive an output of the multiplexer and output a signal that controls the precharge circuit.

7. The method of claim 6, wherein the precharge circuit is enabled for the duration of the stress mode, and the duration of the stress mode is determined by a logic level of an external signal.

8. The method of claim 6, wherein the stress voltage is applied to a single word line of the semiconductor memory device during at least a portion of the stress mode.

9. The method of claim 6 further comprising, configuring the multiplexer to output the stress enable signal during the stress mode and output the non-stress precharge control signal during a non-stress mode.

10. A semiconductor memory device, comprising:
  a multiplexer arrangement configured to switch a timing signal that controls an internal timing of the semiconductor memory device from an internal signal to an external signal during a stress mode; and
  one or more word lines of the semiconductor memory device receiving a stress voltage greater than a non-stress voltage during the stress mode, wherein a duration of the stress mode is based upon a period that a logic level of the external signal indicates the semiconductor memory device to operate in the stress mode.

11. The semiconductor memory device of claim 10, wherein the multiplexer arrangement includes: a first multiplexer receiving the external signal and a delayed version of the internal signal;
  a second multiplexer receiving an output of the first multiplexer and the internal signal.

12. The semiconductor memory device of claim 11, wherein the internal and external signals are dock signals.

13. The semiconductor memory of claim 10, wherein, upon transitioning from the stress mode to a normal mode, the multiplexer arrangement switches the timing signal from the external signal to the internal signal, and the one or more word lines of the semiconductor memory device receives the non-stress voltage during the normal mode.

14. The semiconductor memory device of claim 10, further comprising:
  precharge circuit configured to provide a precharge voltage to a bit line of the semiconductor memory device during the stress mode.

15. A semiconductor memory device, comprising:
  one or more word lines of the semiconductor memory device configured to receive a stress voltage during a stress mode;
  a precharge circuit configured to provide a precharge voltage to a bit line of the semiconductor memory device during the stress mode;
  a multiplexer configured to receive, a stress enable signal and a non-stress precharge control signal as inputs, and further configured to receive the stress enable signal as a select signal; and
  an inverter configured to receive an output of the multiplexer and further configured to output a signal that controls the precharge circuit.

16. The semiconductor memory device of claim 15, wherein the precharge circuit is enabled for the duration of the stress mode, and the duration of the stress mode is determined by a logic level of an external signal.

17. The semiconductor memory device of claim 15, wherein the multiplexer outputs the stress enable signal during the stress mode and outputs the non-stress precharge control signal during a non-stress mode.

18. An apparatus for performing a stress test on a semiconductor memory device, comprising:
  means for transitioning the semiconductor memory device from normal mode to a stress mode;
  means for switching a timing signal that controls an internal timing of the semiconductor memory device from an internal signal to an external signal; and
  means for applying a stress voltage greater than a non-stress voltage to one or more word lines of the semiconductor memory device during the stress mode, wherein a duration of the stress mode is based upon a period that a logic level of the external signal indicates the semiconductor memory device to operate in the stress mode.

19. The apparatus of claim 18, further comprising:
  means for transitioning the semiconductor memory device from the stress mode back to a normal mode; and
  means for switching the timing signal from the external signal to the internal signal; and
  means for applying the non-stress voltage to one or more word lines of the semiconductor memory device during the normal mode.

20. The apparatus of claim 18, further comprising:
  means for enabling, during the stress mode, a precharge circuit to provide a precharge voltage to a bit line of the semiconductor memory device.

21. An apparatus for performing a stress test on a semiconductor memory device, comprising:
  means for transitioning the semiconductor memory device from normal mode to a stress mode;
  means for applying a stress voltage to one or more word lines of the semiconductor memory device during the stress mode;
  means for enabling, during the stress mode, a precharge circuit to provide a precharge voltage to a bit line of the semiconductor memory device;
  multiplexor means for receiving a stress enable signal and a non-stress precharge control signal as inputs and the stress enable signal as a select signal; and
  inverter means for receiving an output of the multiplexer and outputting a signal that controls the precharge circuit.

22. The apparatus of claim 21, wherein the precharge circuit is enabled for the duration of the stress mode, and the duration of the stress mode is determined by a logic level of an external signal.

23. A non-transitory computer-readable medium containing instructions stored thereon, which, when executed by a semiconductor memory device, cause the semiconductor memory device to perform operations, the instructions comprising:
  program code to transition the semiconductor memory device from normal mode to a stress mode;

program code to switch a timing signal that controls an internal timing of the semiconductor memory device from an internal signal to an external signal; and program code to apply a stress voltage greater than a non-stress voltage to one or more word lines of the semiconductor memory device during the stress mode, wherein a duration of the stress mode is based upon a period that a logic level of the external signal indicates the semiconductor memory device to operate in the stress mode.

24. A non-transitory computer-readable medium containing instructions stored thereon, which, when executed by a semiconductor memory device, cause the semiconductor memory device to perform operations, the instructions comprising:

program code to transition the semiconductor memory device from normal mode to a stress mode;

program code to apply a stress voltage to one or more word lines of the semiconductor memory device during the stress mode;

program code to enable, during the stress mode, a precharge circuit to provide a precharge voltage to a bit line of the semiconductor memory device;

program code to configure a multiplexor to receive a stress enable signal and a non-stress precharge control signal as inputs and the stress enable signal as a select signal; and program code to configure an inverter to receive an output of the multiplexer and output a signal that controls the precharge circuit.

* * * * *